United States Patent [19]

Takahara

[11] Patent Number: 5,493,407
[45] Date of Patent: Feb. 20, 1996

[54] ENCODER IN FACSIMILE APPARATUS GENERATES CODE WORDS WITH ONE BIT ADDRESS INDICATING REMAINING BITS ARE RAW UNENCODED DATA WHEN NUMBER OF PIXELS IN A RUN LENGTH ARE BELOW A PREDETERMINED NUMBER

[75] Inventor: Toru Takahara, Tokyo, Japan

[73] Assignee: NEC Corporation, Tokyo, Japan

[21] Appl. No.: 182,663

[22] Filed: Jan. 13, 1994

Related U.S. Application Data

[63] Continuation of Ser. No. 800,819, Nov. 29, 1991, abandoned.

[30] Foreign Application Priority Data

Nov. 29, 1990 [JP] Japan ..................... 2-331027

[51] Int. Cl.⁶ ................ H04N 1/415; H04N 1/419; H03M 7/46; H03M 7/48
[52] U.S. Cl. ............. 358/261.1; 341/63; 382/245
[58] Field of Search ............. 358/261.1, 426; 341/63, 67; 382/245, 244

[56] References Cited

U.S. PATENT DOCUMENTS

| | | | |
|---|---|---|---|
| 4,163,260 | 7/1979 | Hisao et al. | 358/261.1 |
| 4,327,379 | 4/1982 | Kadakia et al. | 358/261.4 |
| 4,688,100 | 8/1987 | Haganuma et al. | 358/261.1 |
| 5,067,023 | 11/1991 | Kim | 358/261.1 |

OTHER PUBLICATIONS

Patent Abstracts of Japan, vol. 15, No. 355, (E1109) Sep. 9, 1991 & JP-3-136575 Jun. 11, 1991.

*Primary Examiner*—Scott A. Rogers
*Attorney, Agent, or Firm*—Ostrolenk, Faber, Gerb & Soffen

[57] ABSTRACT

A pixel data encoder for use in a facsimile apparatus features a first in first out memory for storing one-dimensional binary pixel data sequences in synchronism with a data acquisition clock; a run length determiner coupled to receive the one-dimensional binary pixel data sequences stored in the first in first out memory, the run length determiner calculating a run length for each of the one-dimensinal binary pixel data sequences received; and an encoding section which issues a one-bit address signal for indicating raw data will be issued and N-bit raw data in the event that the run length is less than a predetermined run length N, the encoding section issuing an address code and a remainder code in the event that the run length exceeds N, the address code consisting of consecutive binary level "1"s with a bit length (M–2) and a binary level "0", and the remainder code consisting of a binary sequence representing the run length wherein the most significant bit of the binary sequence is omitted, M representing a total number of binary digits of the run length.

8 Claims, 4 Drawing Sheets

FIG. 4

| | BLOCK NO. | RUN LENGTH | CODE WORD | | B/W (1-BIT) | CODE WORD LENGTH (BITS) |
|---|---|---|---|---|---|---|
| | | | ADDRESS | REMAINDER | | |
| RAW DATA CODE | 1 | 0<br>1<br>2<br>3 | 0<br>0<br>0<br>0 | RAW DATA (3-BIT)<br>RAW DATA (3-BIT)<br>RAW DATA (3-BIT)<br>RAW DATA (3-BIT) | NONE | 4 |
| WYLE CODE | 2 | 4<br>5<br>6<br>7 | 10<br>10<br>10<br>10 | 00<br>01<br>10<br>11 | YES | 5 |
| | 3 | 8<br>⋮<br>15 | 110<br>⋮<br>110 | 000<br>⋮<br>111 | YES | 7 |
| | 4 | 16<br>17<br>⋮<br>31 | 1110<br>1110<br>⋮<br>1110 | 0000<br>0001<br>⋮<br>1111 | YES | 9 |
| | ⋮ | ⋮ | ⋮ | ⋮ | ⋮ | ⋮ |
| | M-1 | $2^{M-1}$<br>⋮<br>$2^M-1$ | $\underbrace{11\cdots10}_{M-2}$ | $\underbrace{000\cdots0}_{M-1}$ | YES | 2M-1 |

ENCODER IN FACSIMILE APPARATUS GENERATES CODE WORDS WITH ONE BIT ADDRESS INDICATING REMAINING BITS ARE RAW UNENCODED DATA WHEN NUMBER OF PIXELS IN A RUN LENGTH ARE BELOW A PREDETERMINED NUMBER

This is a continuation of application Ser. No. 07/800,819, filed on Nov. 29, 1991, now abandoned.

BACKGROUND OF THE INVENTION

1. Field of the Invention

The present invention relates generally to a one-dimensional pixel (picture element) data encoder for use in a facsimile apparatus, and more specifically to such an encoder by which coding is implemented at a considerably low internal clock rate.

2. Description of the Prior Art

Before turning to the present invention, it is deemed preferable to discuss two known facsimile apparatus with reference to FIGS. 1 and 2.

FIG. 1 is a block diagram schematically showing a concept of a conventional facsimile apparatus having a large capacity memory by which a constant speed scanning is attained. A document reader 10 is arranged to obtain pixel data sequences on a line-by-line basis by scanning a black and white document. The line pixel data sequences 12 thus obtained are successively sent to a memory 14 which has a storage capacity corresponding to one sheet of a document. The pixel data stored in the memory 14 are sent to an encoder 16 which encodes the pixel data sequences applied thereto according to the algorithm proposed in the recommendation T4 of CCITT (The International Telegraph and Telephone Consultative Committee). The encoded pixel data outputted from the encoder 16 are stored in an encoded data memory 18. A transmitter (TX) 20 receives the encoded data from the encoded data memory 18 in synchronism with a transmission speed. Transmitter 20 modulates the data received and sends the data out over a transmission line.

The FIG. 1 arrangement enables the document reader 10 to scan a document at a constant rate even in the case of alternate occurrences of black and while pixels. This is because the pixel data memory 14 has a storage capacity sufficient to compensate for the encoding speed under a worst coding efficiency condition.

However, the apparatus shown in FIG. 1 has encountered the problem of high manufacture cost in that the full page memory 14 is essential. For example, in the case where a document sheet having a paper size of 256 mm×362 mm is scanned with a pixel density of 16-dot/mm×15.4-dot/mm, 3 Mega Bytes memory is necessary. Accordingly, large cost reductions are extremely difficult to achieve.

In order to obviate the need for the aforesaid full page memory, run length coding techniques have been proposed. The run length coding is the coding of lengths of consecutive black and white picture elements for the purpose of transmission redundancy reduction. This technique allows for the compression of two-level picture data obtained by scanning a black and white document.

One example of a pixel data encoder utilizing the run length coding for eliminating a full page memory will be briefly referred to in connection with FIG. 2. This arrangement has been disclosed in Japanese Patent Application No. 1-276870 filed Oct. 23, 1989 and provisionally published under publication No. 3-136575 on Jun. 11, 1991.

A run length calculator 22 receives one-dimensional binary data sequence 24 in synchronism with a data acquisition sync clock 28 and a line sync clock 26. The run length calculator 22 determines the lengths of consecutive black and white pixels. A FIFO (First In First Out) memory 30 receives the run length information 23 using the data acquisition clock 28. In the case where the document sheet has a size 256 mm×362 mm and the scanning density 8-dot/mm, the maximum run length is 2048 dots (viz., 11 bits). Since one additional bit is necessary for discriminating a color (black or white) of the consecutive pixels, the bit length of the run length information 23 totals 12 bits in this instance. The output of the FIFO memory 30 is derived using a data processing clock 29.

A run length encoder 32 is supplied with the run length information stored in the FIFO memory 30 in synchronism of the clock 29 and, encodes the run length information according to "Recommendation T4" of CCITT. In more specific terms, the encoder 32 supplies a ROM (Read Only Memory) 34 with an 8-bit code word which consists of a color discriminating bit (1-bit), a make-up/terminating discriminating bit (1-bit) and a run length (6-bit). The 8-bit code word is converted at the ROM 34 using a look-up table provided therein, into a code (13-bit) and a code length (4-bit). A P/S (Parallel Serial) converter 36, which follows the ROM 34, picks up significant bits of the code data based on the code length. Following this, the converter 36 implements parallel-to-serial conversion on the significant bits and output the significant bits therefrom. The data processing at the P/S converter is synchronized by the clock 29.

With the arrangement shown in FIG. 2, the amount of encoding of the pixel data reaches the maximum when white and black pixels occur alternately. In this case, according to the above-mentioned "Recommendation T4", the code length assigned to a white run length l is 6-bit while the code length assigned to a black run length l is 3-bit. Accordingly, the average amount of codes per pixel is 4.5-bit. This means that the speed of the data processing clock 29 has to be 4.5 times of that of the data acquisition clock 28. Thus, it is difficult to increase the clock rate of the clock 28 in that the maximum speed of the clock 29 is limited by the data processing capacity of the elements used in the encoder.

SUMMARY OF THE INVENTION

It is an object of the present invention to provide a facsimile encoder which is able to considerably reduce the amount of encoding to thereby decrease the required data processing clock speed.

More specifically, the present invention provides a pixel data encoder for use in a facsimile apparatus, which features: a first in first out memory for storing one-dimensional binary pixel data sequences in synchronism with a data acquisition clock; a run length determiner coupled to the first in first out memory to receive the one-dimensional binary pixel data stored in the first in first out memory, the run length determiner calculating a run length for each of the one-dimensional binary pixel data sequences received from the first in first out memory; and an encoding section which issues a one-bit address signal for indicating that raw data will be issued and issues N-bit raw data in the event that the run length of one of the binary pixel data sequences is equal to or less than a predetermined run length N, the encoding section issuing an address code and a remainder code in the event that the run length or one of the binary pixel data sequences exceeds N, the address code consisting of consecutive binary level "1"s with a bit length (M–2) and a binary level "0", and the remainder code consisting of a binary sequence representing the run length wherein the most significant bit of the binary sequence is omitted, M representing a total number of binary digits of the run length.

BRIEF DESCRIPTION OF THE DRAWINGS

The features and advantages of the present invention will become more clearly appreciated from the following description taken in conjunction with the accompanying drawings in which like elements are denoted by like reference numerals and in which:

FIG. 4 is a coding table which demonstrates the relationship between the run lengths and the corresponding code word lengths.

DETAILED DESCRIPTION OF THE PREFERRED EMBODIMENTS

Figure 1:
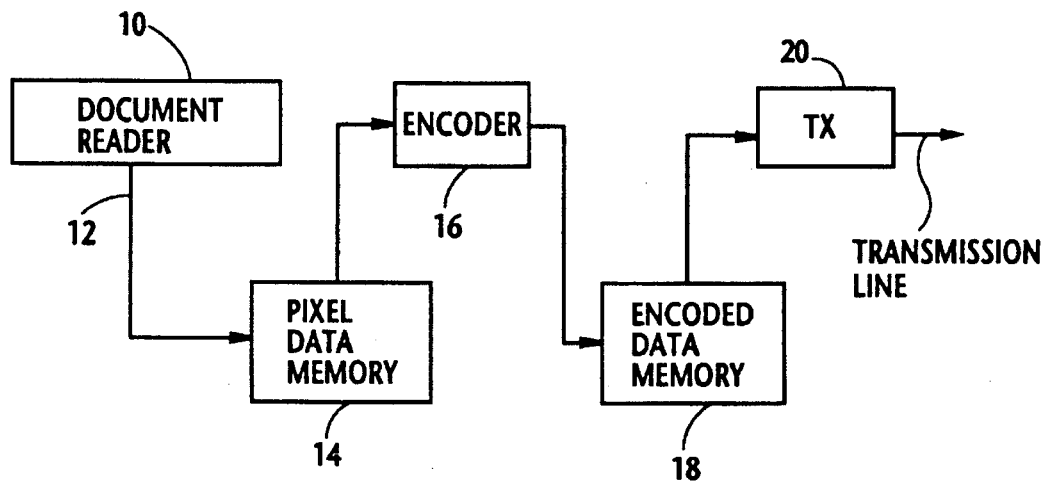
FIG. 1 is a block diagram showing a first of the two prior art arrangements discussed in the opening paragraphs of the instant disclosure.
Figure 2:
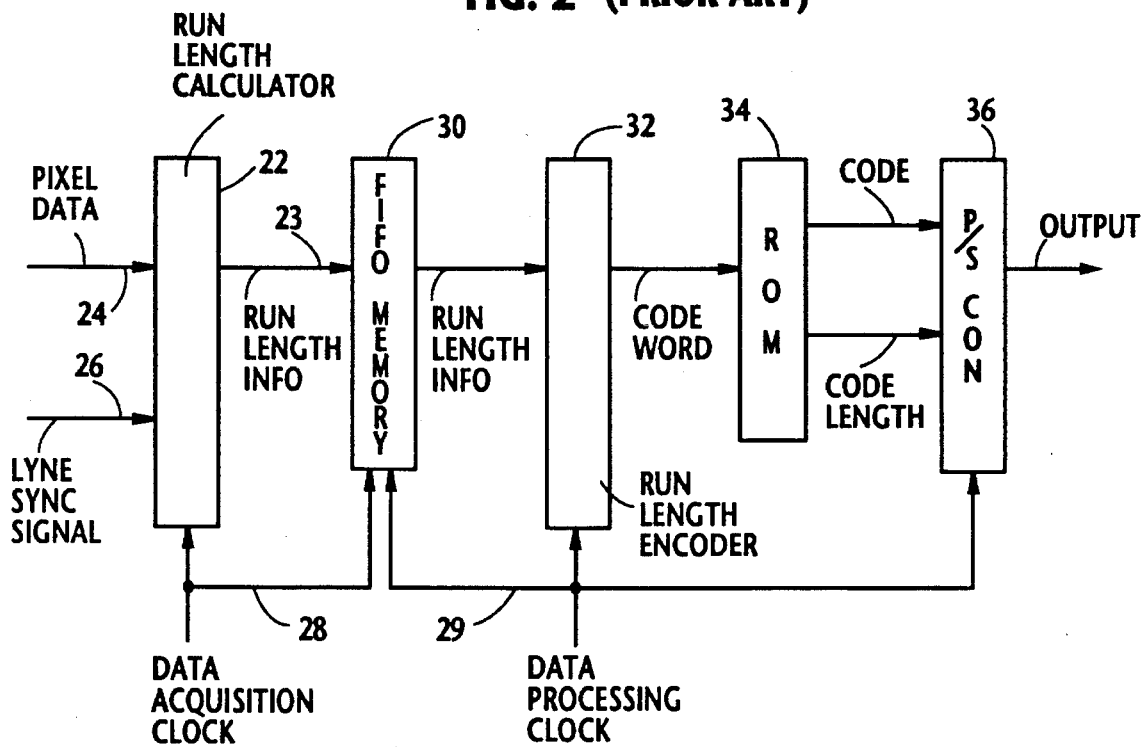
FIG. 2 is a block diagram showing the second of the prior art arrangements previously discussed.
Figure 3:
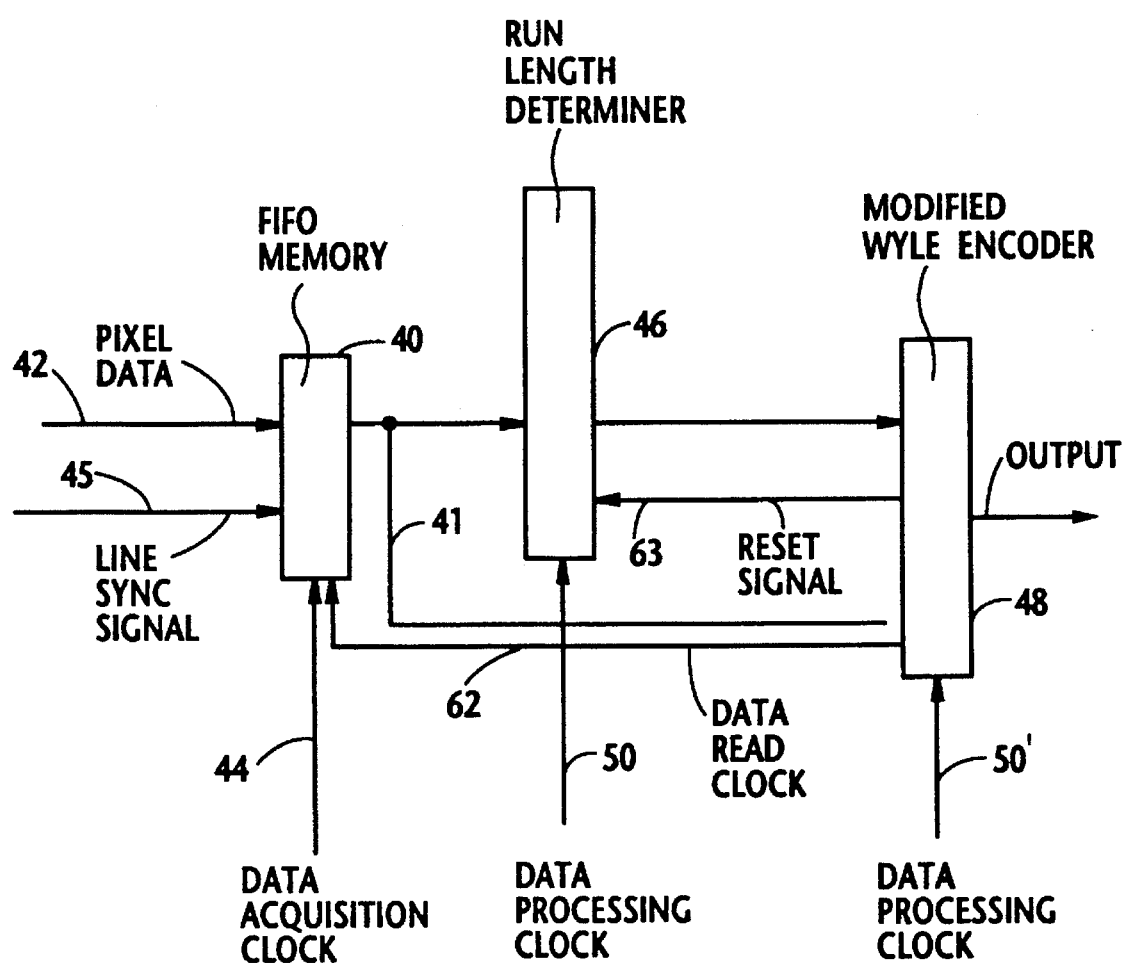
FIG. 3 is a block diagram showing a circuit arrangement which characterizes the present invention.

Reference is now made to FIG. 3 wherein an encoder embodying the present invention is schematically illustrated in block diagram form.

The encoder shown in FIG. 3 includes a FIFO memory 40 which receives a one-dimensional pixel data sequence 42 in synchronism with a data acquisition sync clock 44 and a line sync clock 45. The data sequence thus acquired by the FIFO 40 are applied to a run length determiner or counter 46 and also to a modified Wyle encoder 48 in synchronism with data processing sync clocks 50 and 50'. The run length determiner 46 ascertains lengths of consecutive black and white pixels using the above-mentioned known techniques. Following this, the run length determiner 46 supplies the modified Wyle encoder 48 with the run length information plus color (black or white) information (one bit).

The data acquisition at the encoder 48 is controlled by the data processing sync clock 50'. Merely by way of example, if a document of 256 mm (width)×362 mm (length) is scanned and picture element scanning density is 8-dot/mm, then one line length is 2048 bits (viz., 11 bits). In this instance, the total run length of the data from the run length determiner 46 is represented by 12 bits (=11 bits+one bit for color discrimination).

The modified Wyle encoder 48 is supplied with the data before undergoing the encoding (viz., raw data) from the FIFO memory 40 and the run length data from the determiner 46 and, encodes them in accordance with coding table shown in FIG. 4. The encoder 48 receives the output of the FIFO memory 40 using a data read clock 62. The run length determiner 46 is reset by a reset signal 63 applied from the encoder 48.

The encoding algorithm according to the present invention will be discussed with reference to a modified Wyle coding scheme shown in FIG. 4. The Wyle code per se is well known to those skilled in the art and as such, the detailed descriptions thereof are deemed unnecessary.

As shown in FIG. 4, a code word consists of address bit section, remainder bit section and black/white (B/W) bit section. If a run length is equal to or less than 3-bit run length shown in a Block 1, it is understood from FIG. 4 that:

(a-a) the address bit assumes a logic "0", (a-b) the remainder consists of 3-bit raw picture data, and (a-c) the black/white bit is unnecessary in that a raw picture is to be transmitted.

It follows that the code word length of Block 1 is 4 bits.

It is assumed that the number of binary digits of the maximum run length is denoted by a character "M", and that the situation is such that the run length is equal to or more than 4-bit (viz., Blocks 2 to (M–1). In this instance, (b-a) the address bit length is denoted by one logic "1" or (M–2) consecutive logic "1"s plus one logic "0" (viz., the total address bit length is (M–1)), (b-b) the remainder bit section is formed by deleting the most significant bit (viz., "1") of the run length bit sequence and thus the total length is (M–1) bits, and (b-c) the black/white bit is required in this instance.

Accordingly, the code word length of blocks 2 to (M–1) is represented by 2M–1.

By way of example, the code word corresponding to a white run length 17 is denoted by $$\underline{1\ 1\ 1\ 0} \qquad \underline{0\ 0\ 0\ 1} \qquad \underline{0}$$
$$\text{(address)} \qquad \text{(remainder)} \qquad \text{(white bit)}$$

It is understood that the worst coding efficiency is found in Block 1 wherein, irrespective of the run length, 3-bit of raw data are represented by a 4-bit code word. Accordingly, the maximum coding expansion is approximately 1.33. Therefore, the maximum coding amount per pixel becomes 1.33 bits. In comparison with this, the prior art the maximum coding amount per pixel is 4.5 bits. Therefore, in the event that the data processing clock rate is 10 MHz, the picture signal input speed is 7.5 Mbps (=10 MHz/1.33). This of course compares favorably with the prior art wherein 10 MHz/4.5 bit results in a picture input signal speed of only 2.2 Mbps.

Figure 5:
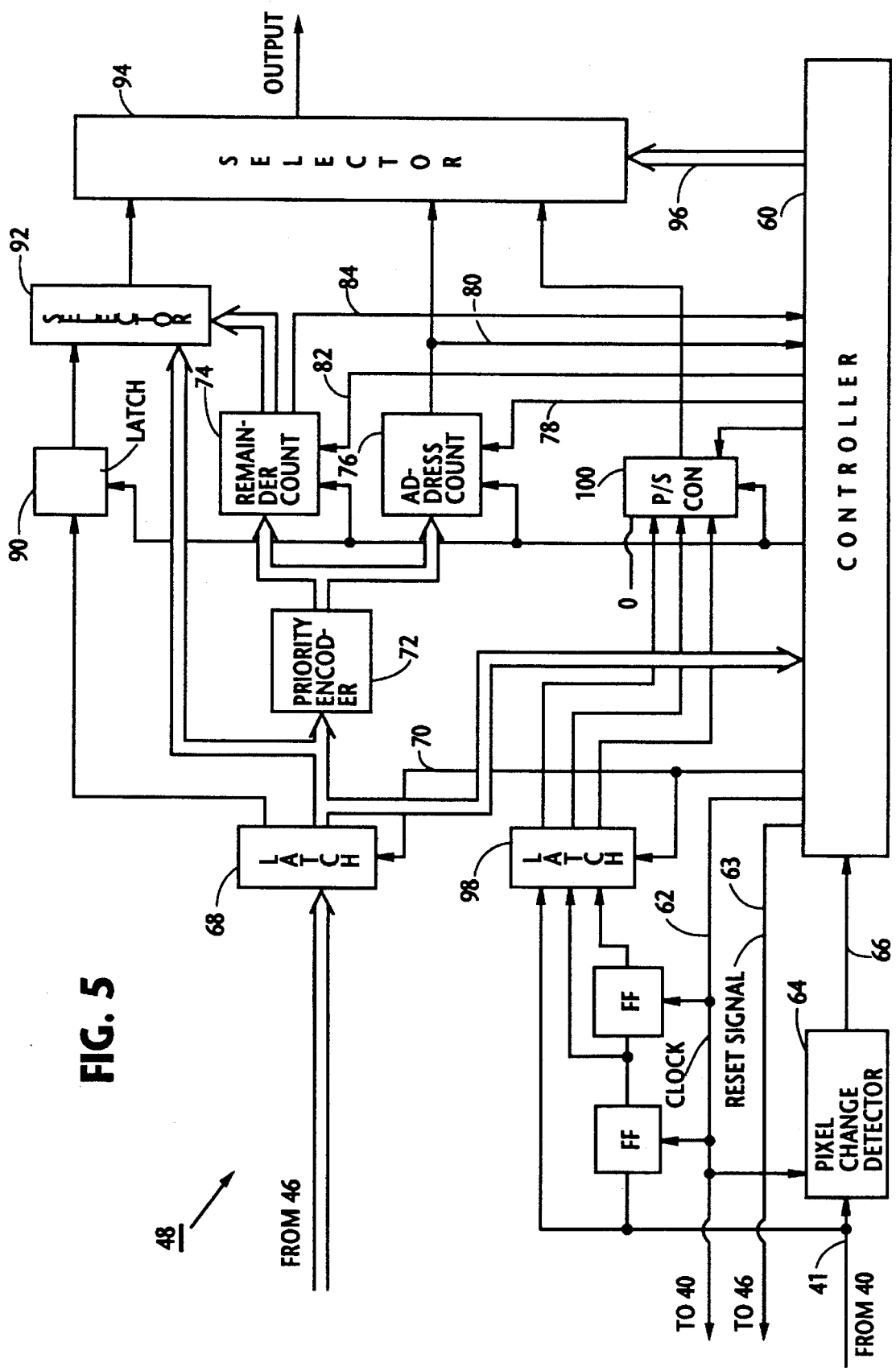
FIG. 5 is a block diagram showing the modified Wyle encoder used in the FIG. 3 arrangement.

Reference is made to FIG. 5, wherein the circuit arrangement of the modified Wyle encoder 48 is exemplified in block diagram form.

It is believed that the arrangement of FIG. 5 can be configured by those skilled in the art if given the coding table shown in FIG. 4. Therefore, only a simple discussion is presented for the sake of brevity.

Merely for the convenience of description, discussion will be directed to the case where a white run length 17 is encoded at the encoder 48. The FIFO memory 40 (FIG. 3) outputs the pixel data 41 in response to a clock signal 62 issued from a control 60. The pixel data 41 thus derived, is applied to a pixel change detector 64 which detects changes of the consecutive picture elements such as (white ("0")→ black ("1") or black ("1")→white ("0")) and issues a pixel change signal 66 to the controller 60. Upon receipt of the pixel change signal 66, the controller 60 ceases to issue the clock signal 62 and latches the run length data from the run length determiner 46 at a latch 68 by issuing a run length latch signal 70. A priority encoder 72 preceded by the latch 68 is arranged to calculate the above-mentioned number (M–1). If the run length is 17, the priority encoder 72 issues the number 4 in that the binary digit number is 5 (viz., M=5). The number 4 (viz., M–1) is applied to a remainder counter 74 and an address counter 76. The address counter 76 is a counter, the content of which is decremeted by a read-out clock 78 applied from the controller 60. An address counter output 80 assumes "0" if the content of the counter 76 is zero. Otherwise, the signal 80 assumes "1". Since the content of the address counter 76 is 4 in this particular case, the output of the address borrow signal 80 changes as follows:

1  1  1  0

The remainder counter 74 decrements in response to a counter clock 82. The remainder counter outputs a signal 84 which assumes "0" in the case where the count value is equal to −1. Otherwise, the signal 84 assumes a value of "1". The controller 60 initiates the issuance of the clock 82 when the address counter output signal 80 assumes "0" and ceases the issuance in response to the remainder counter output signal assumes "0". Since the content of the remainder counter 74 is 4, it outputs the following sequence of numbers:

3  2  1  0  −1

On the other hand, the color discriminating signal, which forms part of the output of the latch 68, is latched at a latch 90, while a selector 92 selects the run length data and the color discriminating data in response to the output of the remainder counter 74. Thus, the output of the remainder counter 74 is:

0  0  0  1        0
(least significant 4-bits of 10001)    (color bit)

The selector 94 produces the outputs of the address counter 76 and the selector 92 in response to a select signal 96. Therefore, the output of the selector 94 is:

1  1  1  0  0  0  0  1  0 as shown in FIG. 4.

When the run length output of the latch 68 is equal to or less than 3, a pixel signal of 3-bit is latched at the latch 98. That is, when the run length outputs of the latch 68 is 1 and 2, 2 and 3 clocks are respectively issued from the controller 60. A P/S converter 100 receives 3-bit pixel signal and bit "0", and issues a 4-bit signal in total to the selector 94.

While the foregoing description describes one embodiment according to the present invention, the various alternatives and modifications possible without departing from the scope of the present invention, which is limited only by the appended claims, will be apparent to those skilled in the art.

What is claimed is:

1. A pixel data encoder for use in a facsimile apparatus, the encoder comprising:
   (a) a first in first out memory for storing sequentially received one-dimensional binary pixel data sequences in synchronism with a data acquisition clock;
   (b) a run length determiner coupled to the first in first out memory to receive the one-dimensional binary pixel data sequences stored in the first in first out memory, the run length determiner determining a run length of each of the binary pixel data sequences by calculating the number of pixels contained in each of the binary pixel data sequences received from the first in first out memory; and
   (c) an encoding section for receiving from the run length determiner the run length of each of the binary pixel data sequences and issuing one of a first and second type of code word for each of the binary pixel data sequences; wherein (1) the first type of code word includes a one-bit address signal for indicating that raw unencoded data will be issued and N-bit raw unencoded data, the encoding section issuing the first type of code word when the run length of the binary pixel data sequence for which the encoding section is issuing one of the first and second types of code word is equal to or less than a predetermined run length N, N being an integer greater than 1;
   (2) the second type of code word includes an address code and a remainder code, the address code consisting of a series of consecutive binary level "1"s and a binary level "0", the series of consecutive binary level "1"s having a bit length equal to M−2, and the remainder code consisting of a binary sequence representing the run length of the binary pixel data sequence for which the encoding section is issuing one of the first and second types of code word, the remainder code is formed by deleting the most significant bit of the binary pixel data sequence, M representing a total number of binary digits of the run length of the binary pixel data sequence for which the encoding section is issuing one of the first and second types of code word, the encoding section issuing said second type of code word when the run length of the binary pixel data sequence for which the encoding section is issuing one of the first and second types of code word exceeds N.

2. The pixel data encoder as claimed in claim 1, wherein N is equal to 3.

3. A pixel data encoder for use in a facsimile apparatus, the pixel data encoder comprising:
   a) means for receiving binary pixel data sequences, each sequence being a string of one or more pixels of the same type;
   b) means for determining the number of pixels in each binary pixel data sequence and:
      i) generating a first type of code word when the number of pixels is less than or equal to N, N being an integer greater than 1; the first type of code word including both a one-bit address signal for indicating that raw data will be issued and N-bit raw unencoded data;
      ii) generating a second type of code word when the number of pixels is greater than N, the second type of code word having encoded data only.

4. The pixel data encoder of claim 3, wherein the second type of code word includes an address code and a remainder code, the address code consisting of a series of consecutive binary level "1"s and a binary level "0", the series of consecutive binary level "1"s having a bit length equal to M−2, and the remainder code consisting of a binary sequence representing the run length of the respective binary pixel data sequence, the remainder code is formed by deleting the most significant bit of the respective binary pixel data sequence, M representing a total number of binary digits in the run length of the respective binary pixel data sequence.

5. The pixel data encoder of claim 4, wherein N is equal to 3.

6. The pixel data encoder of claim 3, wherein the second type of code word includes an address code and a remainder code, the address code consisting of a series of consecutive binary level "1"s and a binary level "0", the series of consecutive binary level "1"s having a bit length equal to M−2, and the remainder code consisting of a binary sequence representing the run length of the respective binary pixel data sequence, the remainder code is formed by deleting the most significant bit of the respective binary pixel data sequence, M representing a total number of binary digits in the run length of the respective binary pixel data sequence.

7. A method for encoding pixel data for use in a facsimile apparatus, the method comprising the steps of:
 a) receiving binary pixel data sequences, each sequence being a string of one or more pixels of the same type;
 b) determining the number of pixels in each binary pixel data sequence and:
  i) generating a first type of code word when the number of pixels is less than or equal to N, N being an integer greater than 1; the first type of code word including both a one-bit address signal for indicating that raw data will be issued and N-bit raw unencoded data;
  ii) generating a second type of code word when the number of pixels is greater than N, the second type of code word having encoded data only.

8. The method of claim 7, wherein N is equal to 3.

* * * * *